United States Patent
Komiya et al.

(10) Patent No.: US 7,984,009 B2
(45) Date of Patent: Jul. 19, 2011

(54) APPARATUS FOR SELECTING MOTOR CONTROLLER

(75) Inventors: Takehiko Komiya, Fukuoka (JP); Takeshi Nagata, Fukuoka (JP); Amane Ando, Fukuoka (JP); Yoshihisa Muta, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 12/782,679

(22) Filed: May 18, 2010

(65) Prior Publication Data

US 2010/0228697 A1 Sep. 9, 2010

Related U.S. Application Data

(63) Continuation of application No. PCT/JP2008/070397, filed on Nov. 10, 2008.

(30) Foreign Application Priority Data

Dec. 11, 2007 (JP) ................................ 2007-319443

(51) Int. Cl.
 *G06F 17/00* (2006.01)
 *G06N 7/04* (2006.01)
(52) U.S. Cl. ........................................................ 706/54
(58) Field of Classification Search .................. 706/54
 See application file for complete search history.

(56) References Cited

U.S. PATENT DOCUMENTS

| 5,822,708 | A | * | 10/1998 | Wagner et al. | 701/54 |
| 6,903,528 | B2 | * | 6/2005 | Komiya | 318/611 |
| 2005/0102074 | A1 | * | 5/2005 | Kolls | 701/29 |
| 2005/0167170 | A1 | * | 8/2005 | Hisada et al. | 180/65.2 |

FOREIGN PATENT DOCUMENTS

| JP | 2001-229210 | 8/2001 |
| JP | 2002-171780 | 6/2002 |
| JP | 2006-033929 | 2/2006 |
| JP | 2006-260350 | 9/2006 |
| JP | 2008-102714 | 5/2008 |

OTHER PUBLICATIONS

International Search Report for International Application No. PCT/JP2008/070397.
Written Opinion of the International Searching Authority for International Application No. PCT/JP2008/070397.

* cited by examiner

*Primary Examiner* — Jeffrey A Gaffin
*Assistant Examiner* — Peter Coughlan
(74) *Attorney, Agent, or Firm* — Ditthavong Mori & Steiner, P.C.

(57) ABSTRACT

Provided is an apparatus for selecting a motor controller, the apparatus including a selection calculation unit, an input unit, an output unit, a mechanism condition input unit, a command setting unit, a monitoring unit, and an evaluation unit. The apparatus can select a motor controller registered in the characteristics database and machine parts registered in a mechanism condition characteristics database on the basis of an operation pattern and a mechanism condition. The apparatus can evaluate whether a combination of the motor controller and the machine parts is operable as a machine system.

10 Claims, 12 Drawing Sheets

FIG. 7A

| No. | MODEL | RATED OUTPUT [W] | EFFECTIVE TORQUE [%] | MAXIMUM TORQUE [%] | RUNNING TORQUE [%] | MAXIMUM NUMBER OF REVOLUTIONS [1/min] | RATIO OF MOMENT OF INERTIA [%] | |
|---|---|---|---|---|---|---|---|---|
| ☐ 1 | SGMAS-A5 | 50 | 27 | 30 | 28 | 300 | 4128 | DETAIL |
| ☑ 2 | SGMAS-01 | 100 | 14 | 15 | 14 | 300 | 2629 | DETAIL |
| ☐ 3 | SGMAS-C2 | 150 | 9 | 11 | 9 | 300 | 1881 | DETAIL |

FIG. 7B

| No. | MODEL | RATED OUTPUT [W] | EFFECTIVE TORQUE [%] | MAXIMUM TORQUE [%] | RUNNING TORQUE [%] | MAXIMUM NUMBER OF REVOLUTIONS [1/min] | RATIO OF MOMENT OF INERTIA [%] |
|---|---|---|---|---|---|---|---|
| ■ 1 | SGMAS-A5 | 50 | 41 | 68 | 28 | 2999 | 4128 |
| ☑ 2 | SGMAS-01 | 100 | 20 | 39 | 14 | 2999 | 2629 |

FIG. 7C

| No. | MODEL | RATED OUTPUT [W] | EFFECTIVE TORQUE [%] | MAXIMUM TORQUE [%] | RUNNING TORQUE [%] | MAXIMUM NUMBER OF REVOLUTIONS [1/min] | RATIO OF MOMENT OF INERTIA [%] |
|---|---|---|---|---|---|---|---|
| ■ 1 | SGMAS-A5 | 50 | 45 | 87 | 28 | 3599 | 4128 |
| ☑ 2 | SGMAS-01 | 100 | 23 | 44 | 14 | 3599 | 2629 |

FIG. 7D

| COUPLING | SUPPLIER A | ACP-001 | ALLOWABLE TORQUE [Nm] | Ct |
| BALL SCREW | SUPPLIER B | BSC-002 | MAXIMUM NUMBER OF REVOLUTIONS | Crev |
| | | | MAXIMUM TRANSLATIONAL MOVEMENT | Ctrn |

APPARATUS FOR SELECTING MOTOR CONTROLLER

CROSS-REFERENCE TO RELATED APPLICATIONS

The present application is a continuation application of PCT/JP2008/070397, filed Nov. 10, 2008, which claims priority to Japanese Patent Application No. 2007-319443, filed Dec. 11, 2007. The contents of these applications are incorporated herein by reference in their entirety.

BACKGROUND OF THE INVENTION

1. Field of the Invention

The present invention relates to an apparatus for selecting a motor controller by referring to conditions of use of the motor controller and machine parts and a characteristics database of the motor controller.

2. Discussion of the Background

Examples of existing methods for selecting a motor capacity include a method described in Japanese Unexamined Patent Application Publication No. 2006-260350. This method allows selection of a motor capacity that is best suited for an operation pattern that a client desires. In order to provide a method for obtaining peripheral information at one time, the method includes a step of combining mechanism elements and setting a desired operation pattern by inputting data to the mechanism elements, and a step of selecting a motor series from a database stored in selection software and displaying a determination result after execution of the selection software. When combining the mechanism elements, in addition to the mechanism elements prepared in the selection software, a new mechanism element designed by the client can be stored in the selection software that has been downloaded.

SUMMARY OF THE INVENTION

According to one aspect of the present invention, an apparatus for selecting a motor controller includes a selection calculation unit that performs calculation for selecting a motor controller on the basis of conditions of use and a characteristics database of the motor controller; an input unit for inputting the conditions of use, the input unit including a mechanism condition input unit for inputting a motor element and machine elements as mechanism conditions, and a command setting unit for setting an operation pattern of one of the elements as the conditions of use, the mechanism condition input unit including a monitoring unit that calculates at least one of physical quantities related to translation or rotation including a position, a velocity, an acceleration, a jerk, and a force that are generated in accordance with the set operation pattern of the motor element or the machine elements and in accordance with the machine elements; an output unit that outputs a selection result of the motor controller; and an evaluation unit that evaluates whether the motor controller or a machine system is operable on the basis of a value calculated by the monitoring unit and a predetermined threshold.

According to another aspect of the present invention, a method for selecting a motor controller includes the steps of inputting a motor element and machine elements as mechanism conditions; setting an operation pattern of one of the elements as conditions of use; calculating at least one of physical quantities with respect to translation or rotation including a position, a velocity, an acceleration, a jerk, and a force that are generated in accordance with the mechanism conditions and the operation pattern; evaluating whether the motor controller or a machine system is operable on the basis of a value calculated in the step of calculating at least one of physical quantities and on the basis of a predetermined threshold; and performing calculation for selecting the motor controller on the basis of the conditions of use and a characteristics database of the motor controller.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 7A to 7D are diagrams illustrating the results of evaluation/selection calculation in the first embodiment;

DESCRIPTION OF THE EMBODIMENTS

Figure 1:
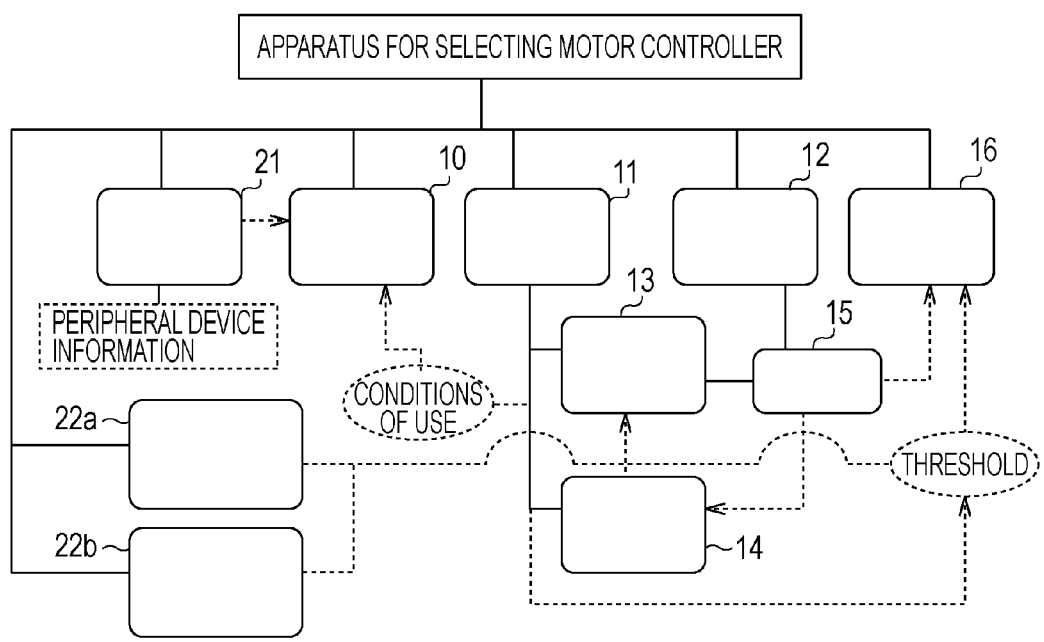
FIG. 1 is a block diagram of an apparatus for selecting a motor controller according to a first embodiment.

Embodiments will now be described with reference to the accompanying drawings, wherein like reference numerals designate corresponding or identical elements throughout the various drawings.

Hereinafter, embodiments of the present invention will be described with reference to the drawings.

FIG. 1 is a block diagram of an apparatus for selecting a motor controller according to a first embodiment of the present invention. FIG. 1 illustrates a selection calculation unit 10, an input unit 11, an output unit 12, a mechanism condition input unit 13, a command setting unit 14, monitoring units 15, an evaluation unit 16, a characteristics database 21, and mechanism condition characteristics databases 22. The mechanism condition characteristics databases 22 include two mechanism condition characteristics databases 22a and 22b that are supplied from two suppliers.

Figure 2:
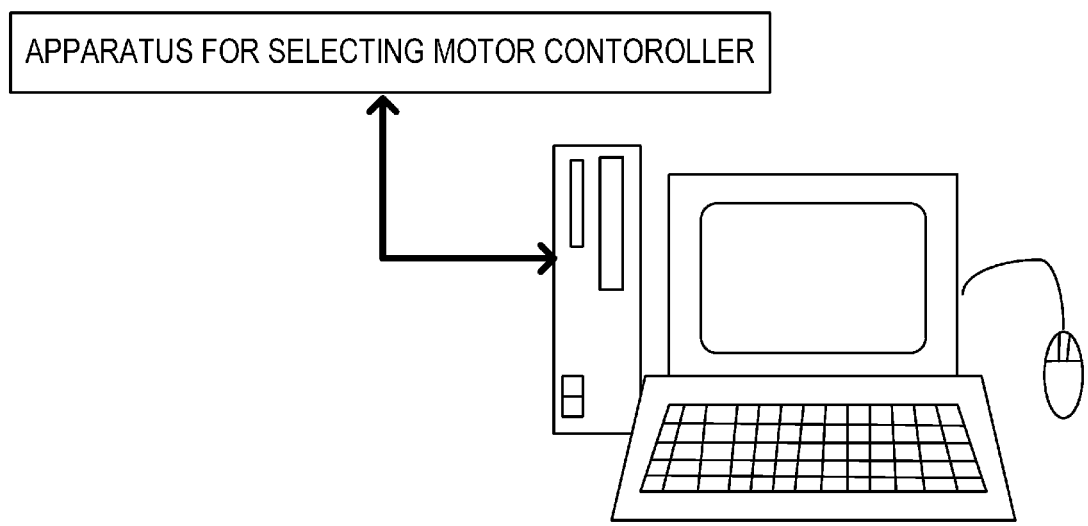
FIG. 2 is a configuration diagram of the apparatus for selecting a motor controller according to the first embodiment.

FIG. 2 is a configuration diagram of the apparatus for selecting a motor controller according to the first embodiment. As illustrated in FIG. 2, the apparatus for selecting a motor controller can be implemented in a personal computer.

Figure 3:
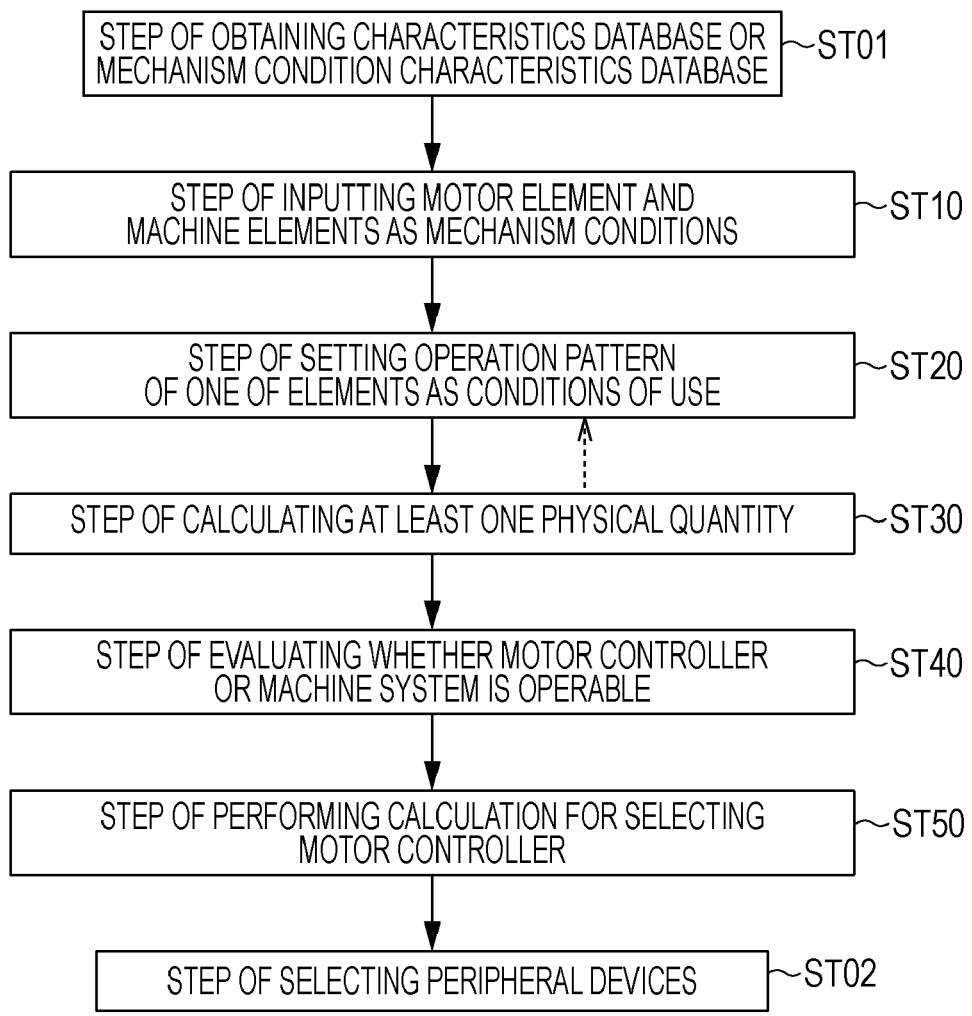
FIG. 3 is a flowchart illustrating a method for selecting a motor controller used in the apparatus according to the first embodiment.

FIG. 3 illustrates steps of a method for selecting a motor controller used in the apparatus according to the first embodiment.

The method includes a step ST01 of obtaining a characteristics database or a mechanism condition characteristics database, a step ST10 of inputting a motor element and machine elements as mechanism conditions, a step ST20 of setting an operation pattern of one of the elements as conditions of use, a step ST30 of calculating at least one physical quantity, a step ST40 of evaluating whether a motor controller or a machine system is operable, a step ST50 of performing calculation for selecting a motor controller, and a step ST02 of selecting peripheral devices.

The method involves the steps illustrated in FIG. 3.

The step ST01 of obtaining a characteristics database or a mechanism condition characteristics database is a step of obtaining the characteristics database 21 including characteristics of motor controllers and the mechanism condition characteristics databases 22a and 22b of machine elements of a machine system operated with a motor controller, the machine elements being mechanism conditions. The characteristics database 21 or the mechanism condition characteristics databases 22 are obtained from a DVD-ROM or a CD-ROM. The characteristics database 21 and the mechanism condition characteristics databases 22 may be obtained by downloading from a website or an FTP server.

A computer program having the function of the apparatus or the method for selecting a motor controller may be obtained from a DVD-ROM or a CD-ROM, or by downloading.

In the step ST10 of inputting a motor element and machine elements as mechanism conditions, machine elements to be included in a machine system operated with a motor controller are input as mechanism conditions.

Figure 4:
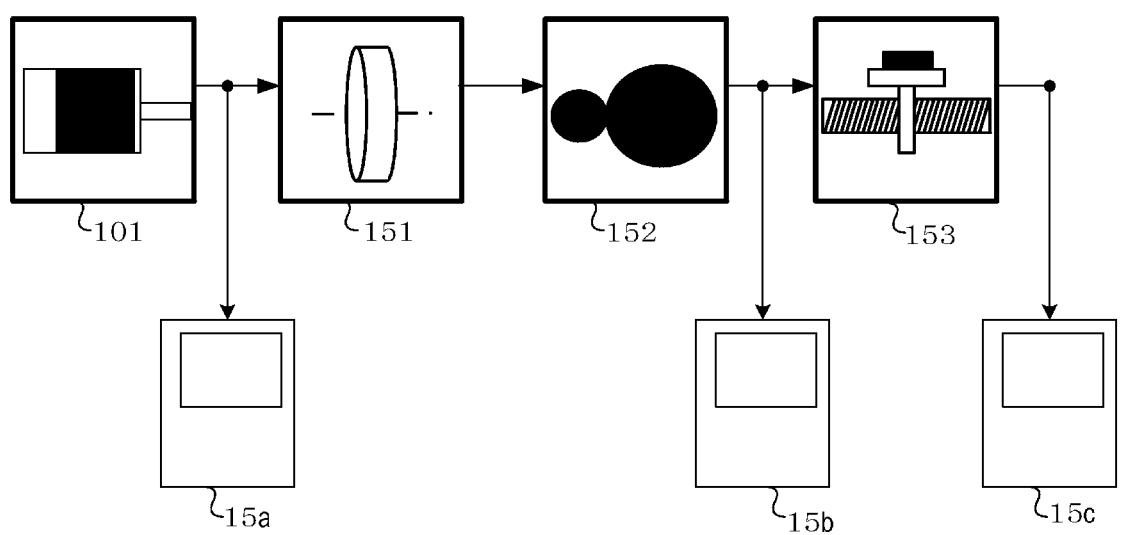
FIG. 4 is a diagram illustrating sample inputs to a mechanism condition input unit in the first embodiment.

FIG. 4 is a diagram illustrating sample inputs to the mechanism condition input unit 13 in the first embodiment. FIG. 4 illustrates a motor model 101, a coupling model 151, a reduction gear model 152, a ball screw model 153, and the monitoring units 15 (15a, 15b, 15c). The mechanism condition input unit 13 simulates a real machine system operated by a motor controller. The machine system is constituted by a motor 1 (FIG. 8A) and machine elements including a coupling, a reduction gear, and a ball screw.

The machine elements can be selected from the mechanism condition characteristics databases 22a and 22b.

The monitoring unit 15a monitors an output from the motor model 101 or an input to the coupling model 151. The monitoring unit 15b monitors an output from the reduction gear model 152 or an input to the ball screw model 153, and the monitoring unit 15c monitors an output from the ball screw model 153. The monitoring unit 15b monitors a physical quantity related to rotational motion, and the monitoring unit 15c monitors a physical quantity related to translational motion. In the step ST30, these monitoring units 15 refer to the input in the step ST20 and a value determined from the configuration obtained in the step ST10.

In the step ST20 of setting an operation pattern of one of the elements as conditions of use, how to operate a machine system with a motor controller is specified. In order to specify how to actually operate the motor 1, a movement pattern or an operation pattern of the motor 1 or the machine elements are input. Movements of the machine elements may be specified. FIGS. 5A to 5F are graphs illustrating sample inputs to the command setting unit 14 in the first embodiment. The command setting unit 14 also serves as the monitoring units 15.

Figure 5:
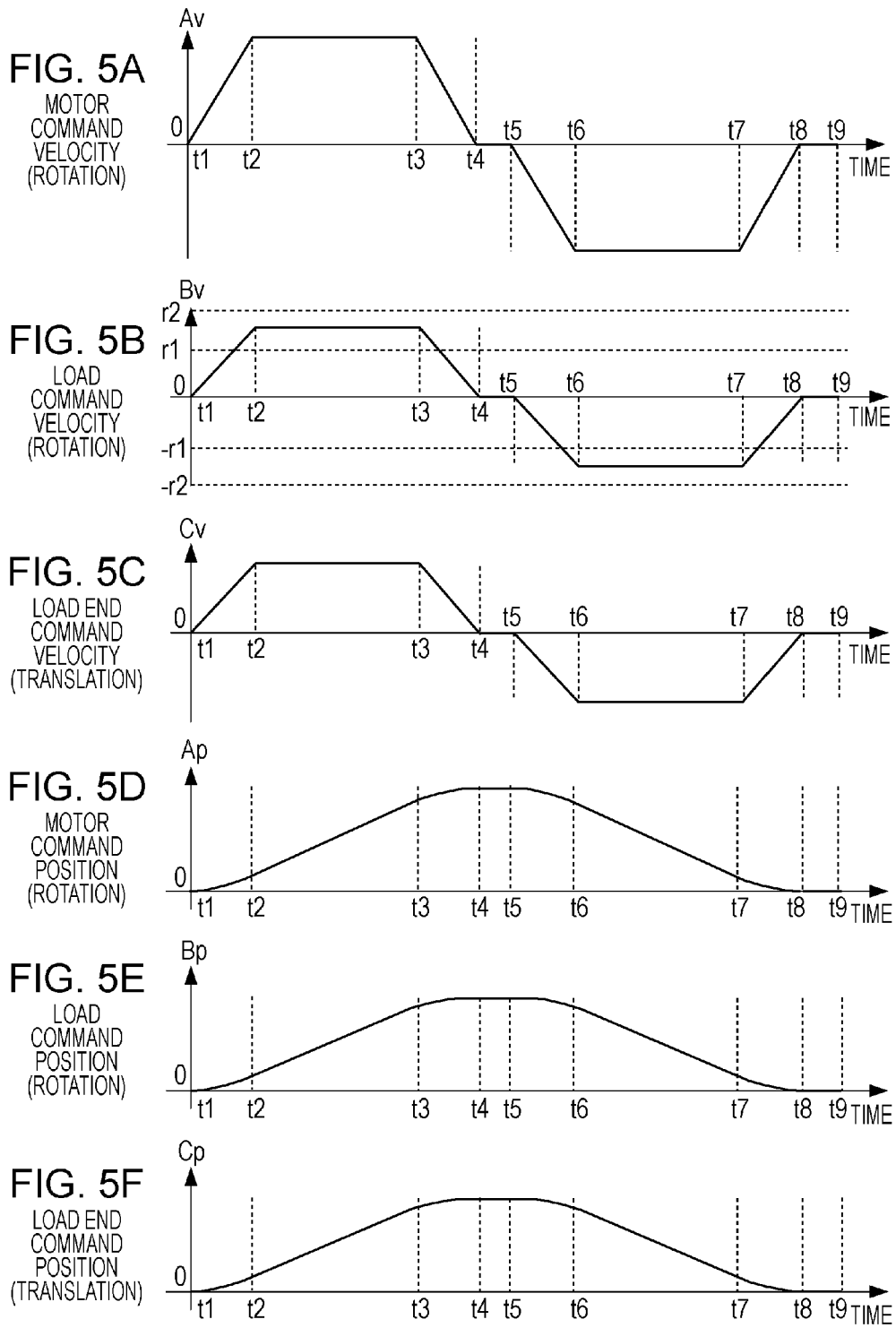
FIGS. 5A to 5F are graphs illustrating sample inputs to a command setting unit according to the first embodiment.

FIGS. 5A, 5B, and 5C illustrate velocity commands, and FIGS. 5D, 5E, and 5F illustrate position commands. When one of FIGS. 5A to 5F is specified, the others are determined. That is, the velocity command of the motor model 101 (FIG. 5A) may be specified, or, the velocity command (FIG. 5C) or the position command (FIG. 5F) of translational motion of the ball screw model 153 located at the load end may be specified.

The step ST30 of calculating at least one physical quantity is a step of obtaining physical quantities of the machine elements that have been input as mechanism conditions and the motor 1 under the conditions input in the steps ST10 and ST20.

The velocity command or the position command has been set in the step ST20 as illustrated in FIG. 5A to 5F. In addition, an acceleration, a jerk, a torque, or a thrust corresponding to the velocity command or the position command specified in the steps ST10 and ST20 can be observed. The units of the physical quantities may be changed.

In order to allow the monitoring units 15 to output the physical quantities, the selection calculation unit 10 calculates the total moment of inertia on the load side using the mechanism conditions that have been input. When a linear motor is selected as the motor 1, the gross mass is calculated. Using the total moment of inertia or the gross mass, the physical quantities monitored by the monitoring units 15 are calculated.

In the step ST40 of evaluating whether the motor controller or the machine system is operable, whether the motor controller or the machine system is operable is evaluated on the basis of the physical quantities that have been estimated and obtained in the step ST30 under the conditions input in the steps ST10 and ST20.

In the step ST40, whether a selection that is incompatible with the specifications of the machine elements has been made can be detected. Outputs from the monitoring units 15 are input to the evaluation unit 16, and whether the machine system is operable is evaluated by referring to the mechanism condition characteristics databases 22. If the monitoring unit 15b illustrated in FIG. 4 detects that the input to the ball screw model exceeds the allowable velocity, an alarm is raised. Thus, not only a motor controller can be selected, but also the machine elements can be reselected beforehand so as to form an operable machine system.

In the step ST50 of performing calculation for selecting a motor controller, machine elements that have been checked are selected and calculation for selecting a motor controller is performed. The selection calculation unit 10 selects a motor controller by referring to the characteristics database 21 on the basis of the conditions input in the steps ST10 and ST20 and the evaluation result obtained in the step ST40.

Figure 6:
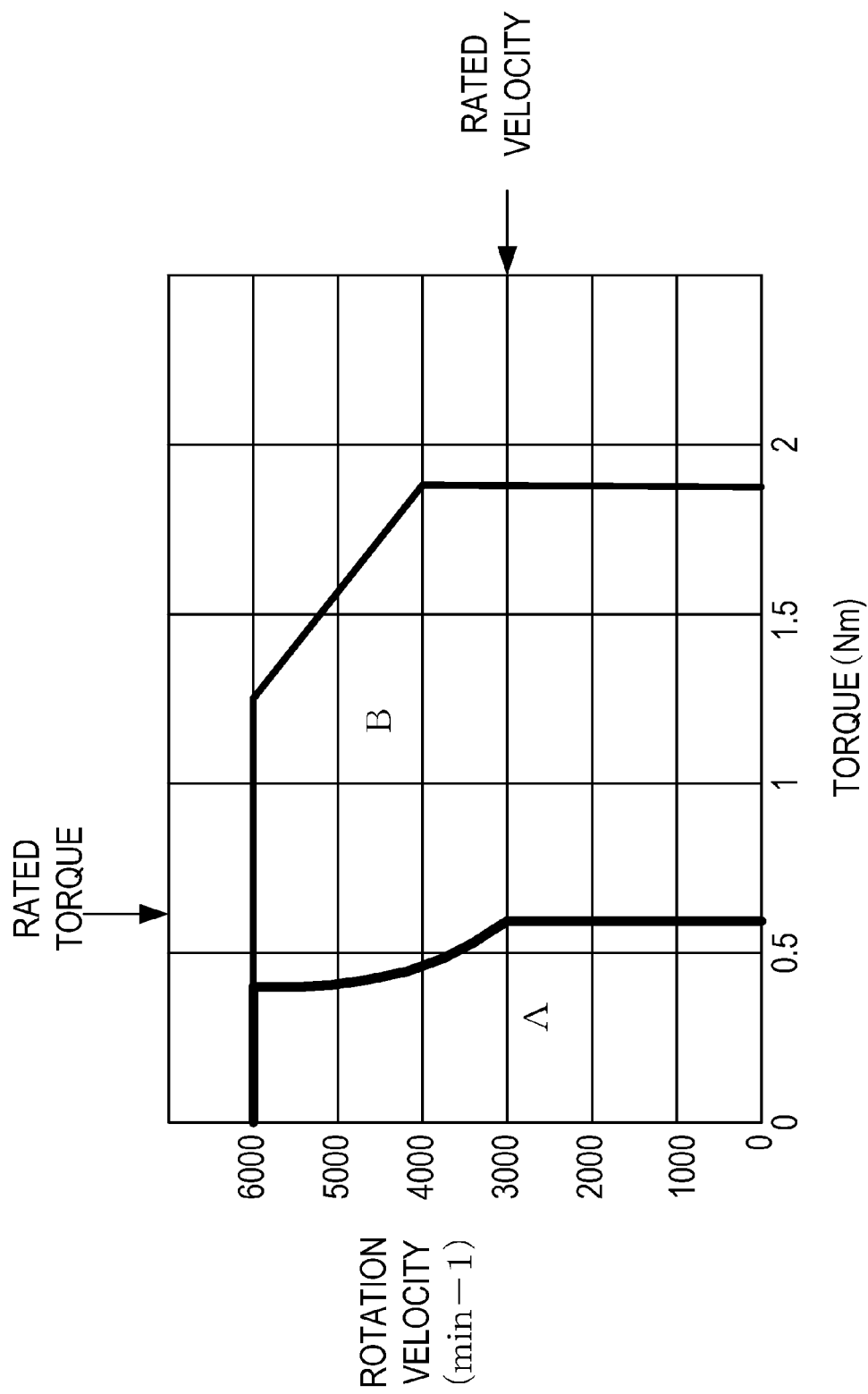
FIG. 6 is a graph illustrating a motor characteristic in the first embodiment.

FIG. 6 is a graph illustrating a motor characteristic in the first embodiment. The characteristics database 21 includes motor characteristics such as that illustrated in FIG. 6. The selection calculation unit 10 estimates the velocity and the torque, which are generated under the conditions that have been input in the steps ST10 and ST20 as illustrated in FIG. 4 and FIGS. 5A to 5F, and selects a motor by referring to a motor characteristic such as that illustrated in FIG. 6. After selecting the motor, the selection calculation unit 10 selects a controller used in combination with the motor.

FIGS. 7A to 7D are diagrams illustrating the results of evaluation/selection calculation in the first embodiment. FIGS. 7A, 7B, and 7C illustrate examples of selection candidates for a motor, and FIG. 7D illustrates the result of evaluating machine parts.

It is necessary to select a motor in accordance with the conditions of use because the capacity of a motor varies depending on the effective torque, the running torque, the maximum number of revolutions, and the ratio of moment of inertia. When the conditions of use are changed, the remaining capacities of the selection candidates change as illustrated in FIGS. 7A, 7B, and 7C. The remaining capacities are represented by the bar graphs illustrated on the right side of the values.

In each of FIGS. 7A and 7B, one of the motors does not have remaining capacity with respect to the ratio of moment of inertia, which indicates that this motor is incompatible. In FIG. 7C, besides the ratio of moment of inertia, the remaining capacities of both motors are insufficient with respect to the maximum number of revolutions. However, in view of the torque-speed curve illustrated in FIG. 6, these motors are compatible if the motors can be used above the rated number of revolutions where the rated torque decreases.

The remaining capacities, which are represented by the bar graphs in FIGS. 7A to 7D, may be represented with characters or symbols. Even if a motor does not have a remaining capacity with respect to the ratio of moment of inertia, the motor may be used under another condition. Incompatible items may not be displayed.

When a user selects a motor, a controller is determined. Criteria for selecting a controller may be input.

FIG. 7D illustrates the evaluation results of machine parts, representing the remaining capacities with bar graphs in the same manner. Whether a problem occurs when a torque required for a motor is applied to a coupling is evaluated. Moreover, whether the number of revolutions of the ball screw is equal to or lower than the allowance is evaluated. If the selected ball screw is of a slider-type with a linear motion guide, the linear travel distance of a table unit thereof may be checked using the command pattern as illustrated in FIG. 5F.

In the step ST02 of selecting peripheral devices, peripheral devices to be used in combination with the motor and the controller are selected. In this step, peripheral devices necessary for activating the motor controller are selected.

Figure 8A:
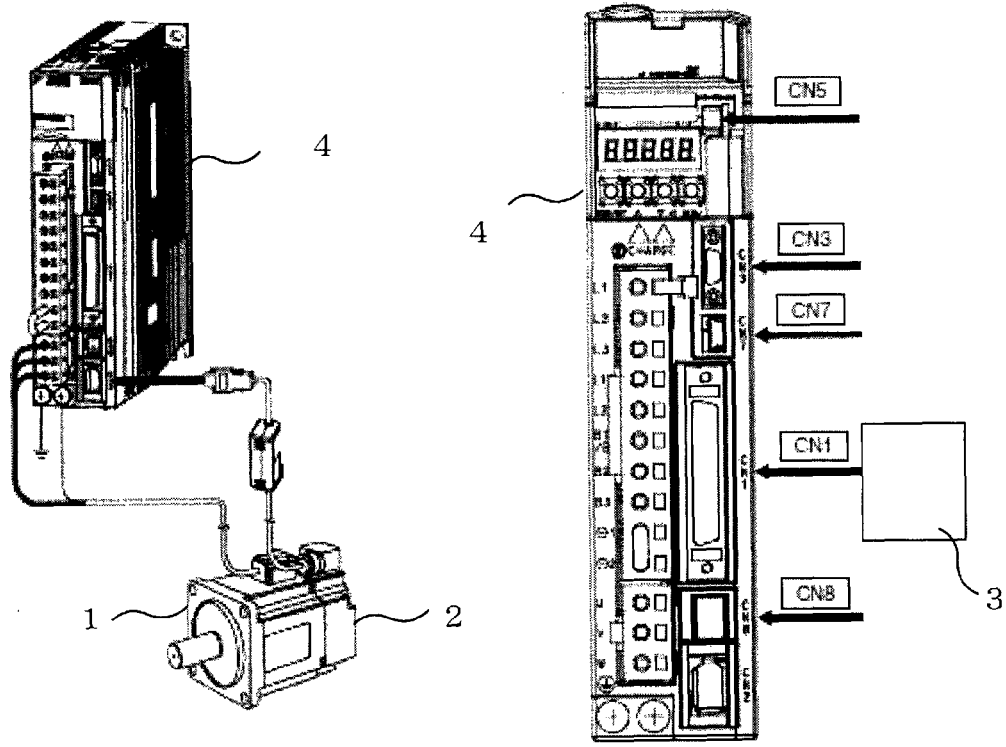
FIGS. 8A to 8C illustrate a motor, a controller, and peripheral devices in the first embodiment.
Figure 8B:
Figure 8C:

FIGS. 8A to 8C illustrate a motor, a controller, and peripheral devices in the first embodiment. As illustrated in FIG. 8A, in order to activate the motor controller, a motor main circuit cable and a detector cable for connecting the motor 1 to a controller 4 are necessary. FIG. 8B illustrates the motor main circuit cable, and FIG. 8C illustrates the detector cable.

If necessary, peripheral devices to be connected to connectors CN1 to CN8 of the controller 4 are selected.

The selection calculation unit 10 refers to peripheral device information included in the characteristics database 21, and selects peripheral devices to be used in combination with the motor 1 and the controller 4.

As described above, a motor controller and machine parts are selected in accordance with the conditions of use, and peripheral devices can also be selected.

In the first embodiment, a motor is selected not by determining the motor model 101 in FIG. 4 but by determining the motor in the step 50, which is a step of selecting a motor controller. Alternatively, in the step ST10 of inputting a motor element and machine elements as mechanism conditions, a motor may be determined and set with the mechanism condition input unit 13 as illustrated in FIG. 4, and the motor may be evaluated with the evaluation unit 16 as to whether the motor can be used under the conditions of use.

The monitoring units 15a to 15c illustrated in FIG. 4 are independently provided. However, each of the motor element and machine elements may have the function of a corresponding one of the monitoring units 15. Each of the motor element and the machine elements may include a corresponding one of the monitoring units 15 for monitoring an input and an output. For example, the ball screw model 153 may be capable of monitoring the physical quantities related to rotation and translation.

The step ST10, which is a step of inputting a motor element and machine elements as mechanism conditions, may be first performed so as to determine and set a motor, and subsequently, the step ST02, which is a step of selecting peripheral devices, may be performed so that the selection calculation unit 10 selects the peripheral devices such as those illustrated in FIGS. 8A to 8C by referring to a peripheral device database 23.

Hereinafter, a second embodiment of the present invention will be described with reference to the drawings.

Figure 9:
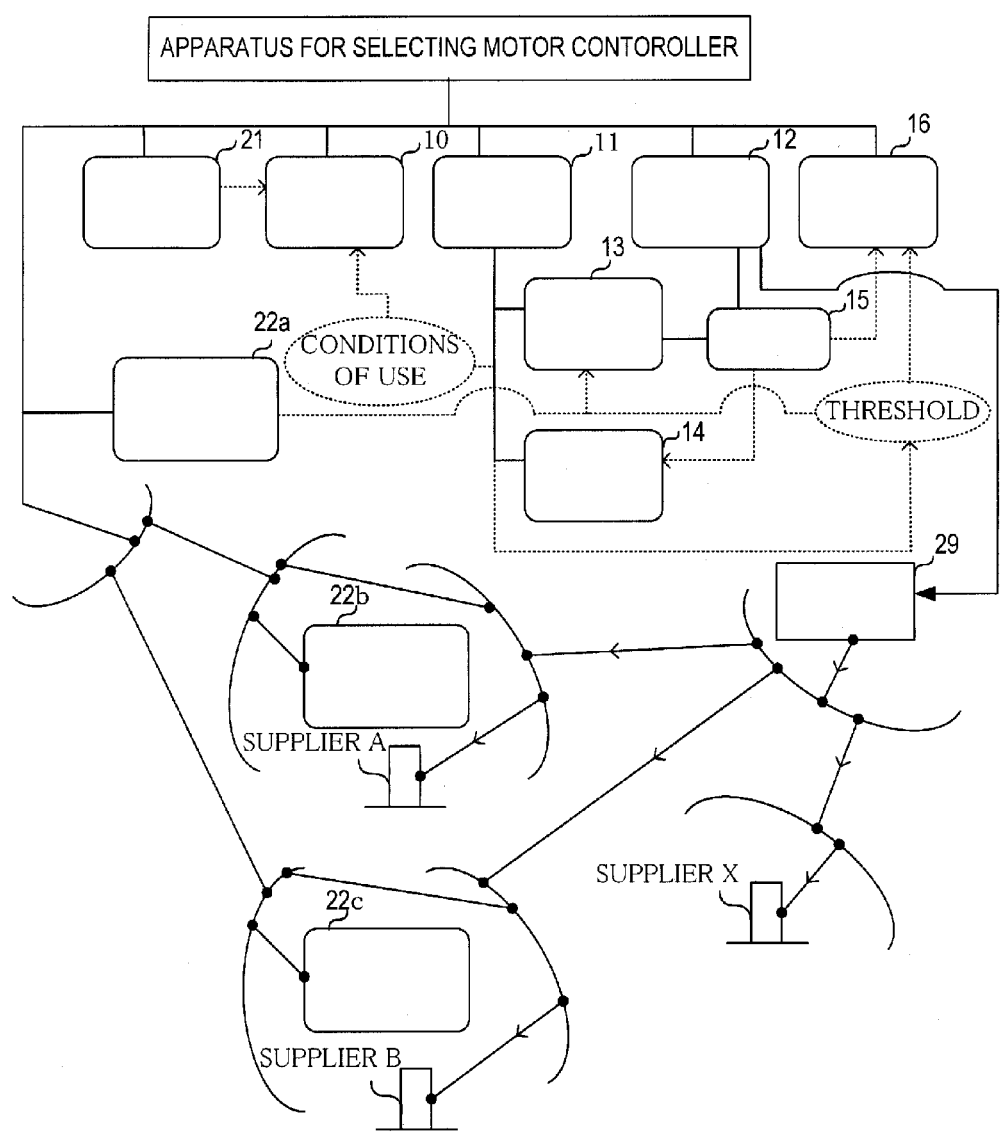
FIG. 9 is a block diagram of an apparatus for selecting a motor controller according to a second embodiment.

FIG. 9 is a block diagram of an apparatus for selecting a motor controller according to the second embodiment.

Figure 10:
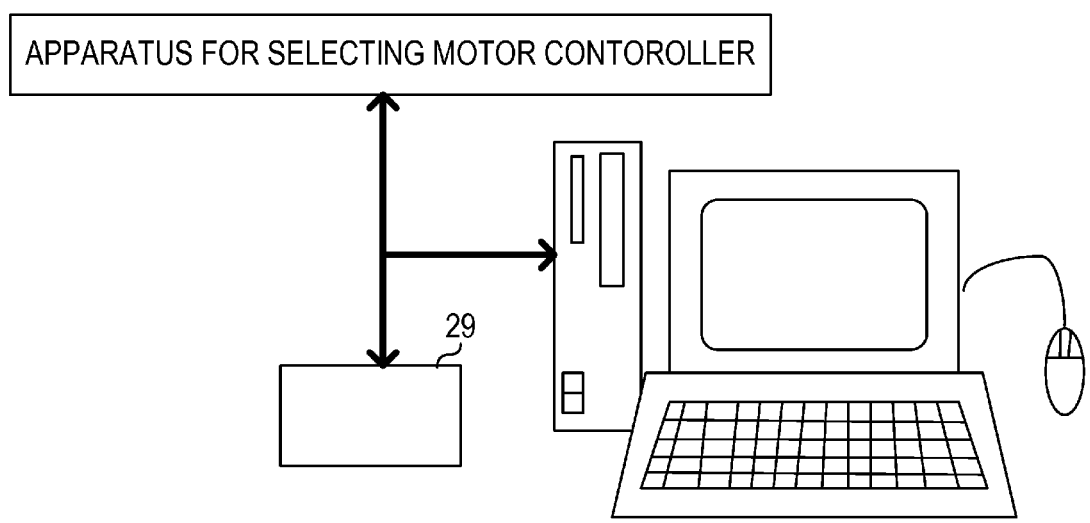
FIG. 10 is a configuration diagram of the apparatus for selecting a motor controller and an ordering apparatus according to the second embodiment.

In FIG. 9, an ordering apparatus 29 is illustrated. Mechanism condition characteristics databases 22 include a mechanism condition characteristics database 22a equipped in the apparatus for selecting a motor controller, a mechanism condition characteristics database 22b that is present in the environment of a supplier A, and a mechanism condition characteristics database 22c that is present in the environment of a supplier B. FIG. 10 is a configuration diagram of the apparatus for selecting a motor controller and an ordering apparatus according to the second embodiment.

Figure 11:
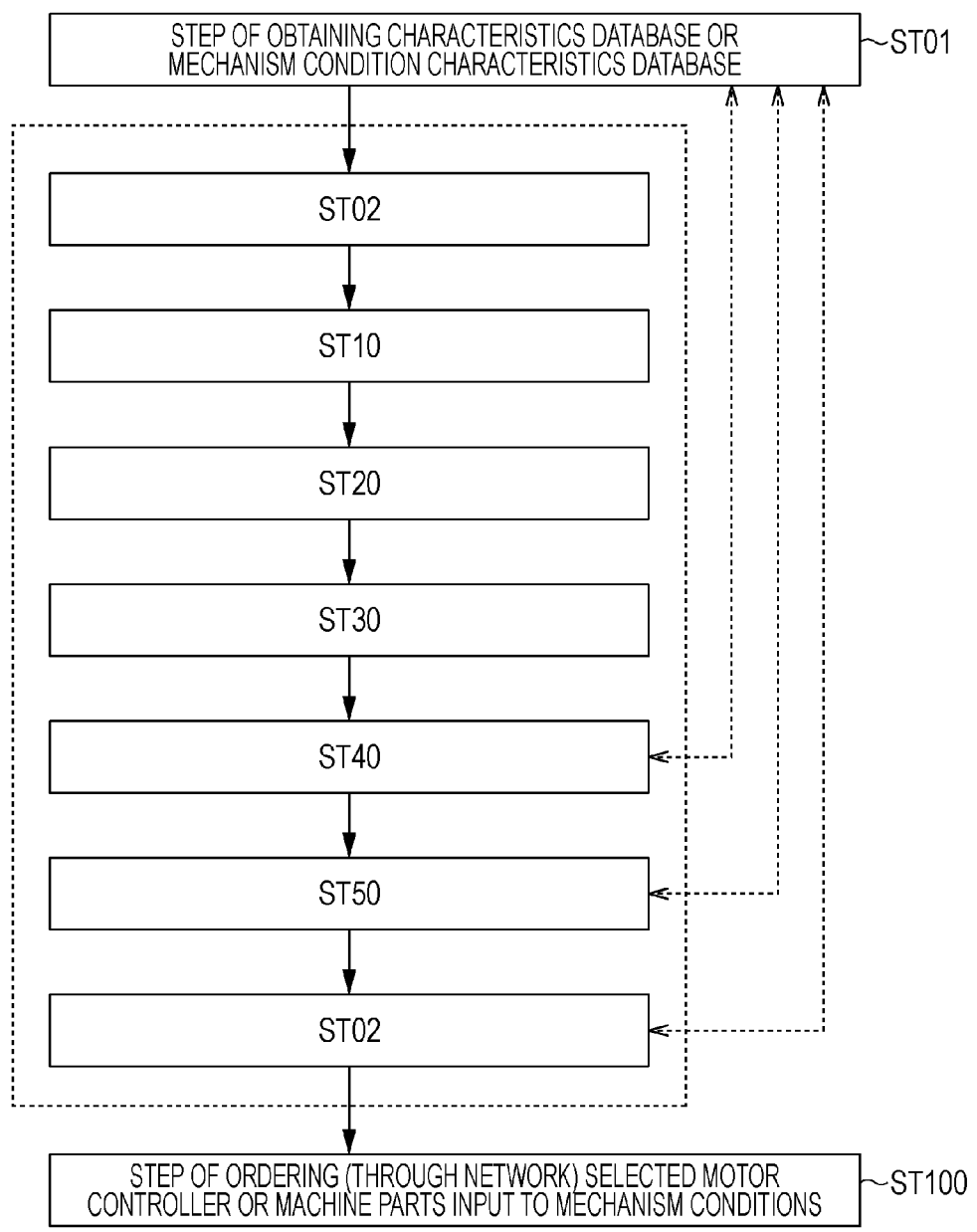
FIG. 11 is a flowchart illustrating a method for selecting a motor controller and a method for placing an order used in the apparatuses according to the second embodiment.

FIG. 11 is a flowchart illustrating a method for selecting a motor controller and a method for placing an order used in the apparatuses according to the second embodiment. In FIG. 11, the step ST100 is a step of ordering, through a network, a motor controller that has been selected or machine parts that have been input to the mechanism conditions.

As illustrated in FIG. 9, the second embodiment is different from the first embodiment in that the second embodiment includes the ordering apparatus 29 and in that the mechanism condition characteristics databases 22 include not only a database equipped in the apparatus for selecting a motor controller but also databases that are present in the environments of the supplier A and the supplier B. FIG. 10 is different from FIG. 2 illustrating the first embodiment in that FIG. 10 includes the ordering apparatus 29.

As illustrated in FIG. 11, the method used in the second embodiment is different from that used in the first embodiment in that the method used in the second embodiment includes the step ST100 of ordering, through a network, a motor controller or machine parts input to the mechanism conditions. Because the mechanism condition characteristics databases 22b and 22c are present in the environments of the supplier A and the supplier B, the second embodiment is different from the first embodiment in that the step ST01 of obtaining the mechanism condition characteristics databases 22b and 22c is a step of accessing the mechanism condition characteristics databases 22b and 22c in the environments of the supplier A and the supplier B and in that reference to the mechanism condition characteristics database 22 is made in the steps ST40, ST50, and ST02 where the information is needed.

The method for selecting a motor controller used in the second embodiment is different from that used in the first embodiment in that, in the step ST01 of obtaining the characteristics database or the mechanism condition characteristics database, obtaining the mechanism condition characteristics databases 22b and 22c is accessing the mechanism condition characteristics databases 22b and 22c that are present in the environments of the supplier A and supplier B. However, as with the first embodiment, the method involves the sequential steps ST01, ST10, ST50, and ST02.

In the step ST100, which is illustrated in FIG. 11, of ordering the motor controller that has been selected or the machine parts that have been input to the mechanism conditions, either or both of the motor controller and the machine parts that have been selected are ordered through a network.

The motor controller, the machine parts, and the peripheral devices that have been selected are ordered for predetermined suppliers. The suppliers to receive the orders are registered beforehand in the ordering apparatus 29. Order of the motor controller, the machine parts, and the peripheral devices are respectively placed to corresponding suppliers.

The selection results may be output to the electronic file and sent to the suppliers through a network.

Because the ordering apparatus 29 is connected to the suppliers through a network, an order can be readily placed on the basis of the selection result.

The motor controller may select a full-closed control configuration or a linear-motor drive configuration.

Figure 12:
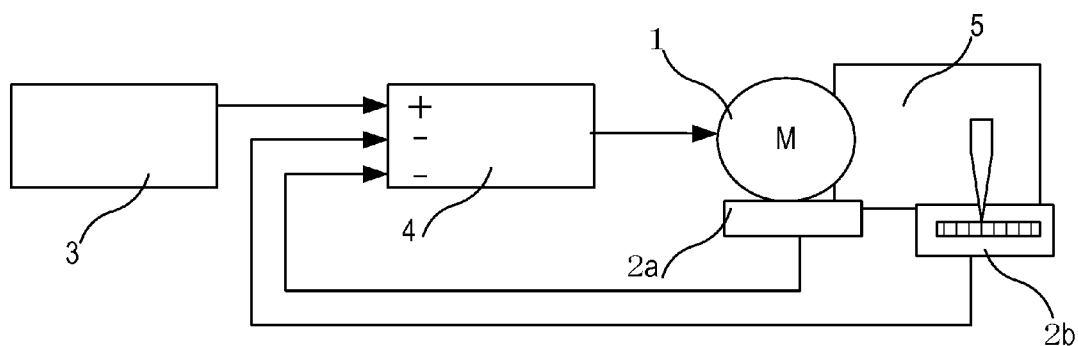
FIG. 12 is a configuration diagram of full-closed control in the second embodiment.
Figure 13:
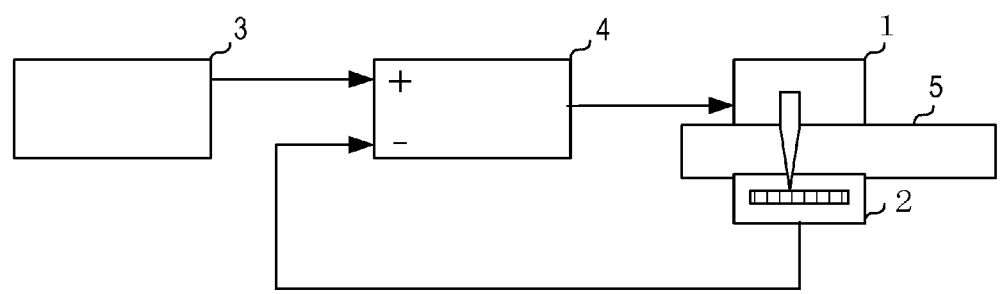
FIG. 13 is a configuration diagram of a linear-motor drive in the second embodiment.

FIG. 12 is a configuration diagram of full-closed control. FIG. 13 is a configuration diagram of a linear-motor drive.

In order to perform full-closed control as described in FIG. 12, the controller 4 has to have a full-closed control function. Therefore, an additional input condition may be provided to the step ST50 of performing calculation for selecting a motor controller, and the controller 4 that is compatible with the candidates for the motor illustrated in FIGS. 7A to 7D of the first embodiment may be selected.

In the configuration illustrated in FIG. 13, a linear motor is necessary. Therefore, in the step ST10 of inputting a motor element and machine elements as mechanism conditions, a linear motor may be selected as the motor element.

A detector 2b for full-closed control and a detector 2 for the linear motor may be selected in the step ST02 of selecting peripheral devices.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An apparatus to select a motor controller, comprising:
   an input device comprising:
      a mechanism condition input device configured to input motor elements and machine elements as mechanism conditions;
      a command setting device configured to set an operation pattern of one of combinations of the motor elements and the machine elements as conditions of use; and
   the mechanism condition input device comprising:
      a calculator configured to calculate at least one of physical quantities including a position, a velocity, an acceleration, a jerk, and a force that are generated in accordance with the set operation pattern of the motor elements or the machine elements and in accordance with the machine elements;
   an output device configured to output a selection result of the motor controller;
   an evaluation device configured to evaluate whether the motor controller or a machine system is usable based on at least one of the physical quantities calculated by the calculator and a predetermined threshold; and
   a selection calculation device configured to select a motor controller based on the conditions of use set by the command setting device, a characteristics database of the motor controller, and an evaluation result evaluated by the evaluation device.

2. The apparatus to select a motor controller according to claim 1,
   wherein the command setting device can edit, change, and set the operation pattern of one of the combinations of the motor elements and the machine elements and can refer to at least one of the physical quantities calculated by the calculator.

3. The apparatus to select a motor controller according to claim 1,
   wherein the characteristics database of the motor controller includes at least one mechanism condition characteristics database including the machine elements supplied by at least one supplier.

4. The apparatus to select a motor controller according to claim 3,
   wherein the mechanism condition characteristics database includes the threshold used by the evaluation device.

5. The apparatus to select a motor controller according to claim 3,
   wherein the evaluation device is configured to output to the output device remaining capacities of the motor elements based on the characteristics database including characteristics of the motor controller or remaining capacities of the machine elements based on the mechanism condition characteristics database including characteristics of the machine elements in accordance with a predetermined criterion.

6. The apparatus to select a motor controller according to claim 3,
   wherein the characteristics database or the mechanism condition characteristics database is configured to obtain from a storage medium storing the characteristics database or the mechanism condition characteristics database or configured to obtain through a network.

7. The apparatus to select a motor controller according to claim 3,
   wherein the characteristics database or the mechanism condition characteristics database is connected to a database of at least one supplier through a network.

8. The apparatus to select a motor controller according to claim 1,
   wherein the characteristics database includes, in addition to characteristics of a motor and the motor controller, a peripheral device database containing information of peripheral devices to be used in combination with the motor and the motor controller in accordance with a result of a selection selected by the selection calculation device.

9. The apparatus to select a motor controller according to claim 8, further comprising;
   a peripheral device selection device configured to select peripheral devices to be used in combination with the motor and the motor controller from the peripheral device database.

10. An apparatus to select a motor controller comprising;
   a selection calculation device configured to select a motor controller based on conditions of use and a characteristics database of the motor controller;
   an input device comprising:
      a mechanism condition input device configured to input motor elements and machine elements as mechanism conditions;
      a command setting device configured to set an operation pattern of one of combinations of the motor elements and the machine elements as the conditions of use; and
   the mechanism condition input device comprising:

a calculator configured to calculate at least one of physical quantities including a position, a velocity, an acceleration, a jerk, and a force that are generated in accordance with the set operation pattern of the motor elements or the machine elements and in accordance with the machine elements;

an output device configured to output a selection result of the motor controller;

an evaluation device configured to evaluate whether the motor controller or a machine system is usable based on at least one of the physical quantities calculated by the calculator and a predetermined threshold; and a peripheral device selection device configured to select peripheral devices to be used in combination with a motor and the motor controller from a peripheral device database.

* * * * *